United States Patent
Ootsuka

(10) Patent No.: US 7,211,154 B2
(45) Date of Patent: *May 1, 2007

(54) ELECTRODE-BUILT-IN SUSCEPTOR

(75) Inventor: Takeshi Ootsuka, Funabachi (JP)

(73) Assignee: Sumitomo Osaka Cement Co., Ltd. (JP)

( * ) Notice: Subject to any disclaimer, the term of this patent is extended or adjusted under 35 U.S.C. 154(b) by 438 days.

This patent is subject to a terminal disclaimer.

(21) Appl. No.: 10/615,894

(22) Filed: Jul. 9, 2003

(65) Prior Publication Data

US 2004/0011287 A1 Jan. 22, 2004

(30) Foreign Application Priority Data

Jul. 16, 2002 (JP) ............... 2002-207234

(51) Int. Cl.
*C23C 16/00* (2006.01)
*C23F 1/00* (2006.01)
*H01L 21/306* (2006.01)

(52) U.S. Cl. .................. 118/728; 118/500; 156/345.51; 156/345.52; 156/345.53

(58) Field of Classification Search ................ 118/728; 156/345.51
See application file for complete search history.

(56) References Cited

U.S. PATENT DOCUMENTS

| | | | | |
|---|---|---|---|---|
| 5,591,269 A * | 1/1997 | Arami et al. | ........... | 118/723 R |
| 5,688,331 A | 11/1997 | Aruga et al. | | |
| 6,475,924 B2 * | 11/2002 | Yamamoto et al. | ......... | 438/758 |
| 6,486,542 B1 * | 11/2002 | Ohashi et al. | .............. | 257/684 |
| 6,645,304 B2 * | 11/2003 | Yamaguchi | ................. | 118/725 |
| 6,693,789 B2 * | 2/2004 | Inazumachi et al. | ........ | 361/234 |
| 2002/0006678 A1 | 1/2002 | Inazumachi et al. | | |
| 2003/0089687 A1 | 5/2003 | Maki | | |
| 2005/0051100 A1 * | 3/2005 | Chiang et al. | .............. | 118/728 |

FOREIGN PATENT DOCUMENTS

| | | |
|---|---|---|
| JP | 63-196844 | 12/1988 |
| JP | 4-3001136 | 10/1992 |
| JP | 6-151044 | 5/1994 |
| JP | 6-151332 | 5/1994 |
| JP | 7-153706 | 6/1995 |
| JP | 10-189696 | 7/1998 |
| JP | 11-163112 | 6/1999 |

(Continued)

OTHER PUBLICATIONS

English translation of Abstract for Japanese Patent Application No. JP-4-3001136.

(Continued)

*Primary Examiner*—Ram Kackar
*Assistant Examiner*—Rakesh Dhingra
(74) *Attorney, Agent, or Firm*—Ostrolenk, Faber, Gerb & Soffen, LLP

(57) ABSTRACT

An electrode-built-in susceptor is formed by a susceptor base body which is made of an aluminium-nitride-group-sintered-member on one of which surface a plate sample is mounted, an inner electrode which is built in the susceptor member, a power supplying terminal which is disposed in the susceptor base body so as to be attached to the inner electrode, and an insulating layer which is formed mainly by one of a boron nitride, a lithium oxide, an aluminium oxide, or a magnesium oxide is formed between the inner electrode and the mounting surface.

By doing this, it is possible to provide an electrode-built-in susceptor which has a superior durability under a high temperature oxidizing atmosphere condition without a concern in that a thermal efficiency decreases and a plate sample is contaminated.

2 Claims, 4 Drawing Sheets

FOREIGN PATENT DOCUMENTS

| | | |
|---|---|---|
| JP | 2000-63177 | 2/2000 |
| JP | 2000-216232 | 8/2000 |
| JP | 2001-308165 | 2/2001 |
| JP | 2001-85505 | 3/2001 |
| JP | 2001-085505 | 3/2001 |
| JP | 2001-287982 | 10/2001 |
| JP | 2003-124296 | 4/2002 |
| JP | 2000-277592 | 10/2002 |
| JP | 2003-152064 | 5/2003 |

OTHER PUBLICATIONS

English translation of Abstract for Japanese Patent Application No. JP-6-151044.
English translation of Abstract for Japanese Patent Application No. JP-6-151332.
English translation of Abstract for Japanese Patent Application No. JP-10-189696.
English translation of Abstract for Japanese Patent Application No.2003-124296.
English translation of Abstract for Japanese Patent Application No. JP-2001-085505.
Office Action issued by Japanese Patent Office on Oct. 18, 2005 in connection with corresponding application No. 2002-207234 and English translation thereof.
Decision of Rejection issued by Japanese Patent Office on Mar. 7, 2006 in connection with corresponding Japanese Patent application No. 2002-207234 and English translation thereof.

* cited by examiner

ELECTRODE-BUILT-IN SUSCEPTOR

BACKGROUND OF THE INVENTION

1. Field of the Invention

Present invention relates to an electrode-built-in susceptor. In particular, the present invention relates to an electrode-built-in susceptor which can prevent a leak electricity under s high temperature oxidizing atmosphere condition.

2. Description of Related Art

In recent years, manufacturing processes such as an etching process, a coating process are performed per a wafer or per a base board uniformly in a production process for a semiconductor device such as an IC (integrated circuit), an LSI (large scale integration), VLSI (very large scale integration). It is the same for manufacturing process for a display device such as a liquid crystal display (LCD) and a plasma display (PDP) and an assembly process for a hybrid IC of the like. A sheet-by-sheet process for a plate sample such as a semiconductor device, a glass base board for a liquid crystal, and a printed circuit board is becoming more common.

In such a sheet-by-sheet process, a plate sample is supported in a processing chamber sheet by sheet, or wafer by wafer. The plate sample is mounted on a sample base which is called as a susceptor and processed for a predetermined time.

It is necessary that such a susceptor can be used under a high temperature plasma condition. Therefore, it is required that such a susceptor has a superior plasma characteristics and a larger thermal conductivity.

For such a susceptor, a susceptor which is made of a aluminium-nitride-group-sintered-member having superior high temperature anti-plasma characteristics is commonly used.

There is a case in which an electrostatic chucking electrode for fixing a plate sample by generating an electric charge and an electrostatic absorbing force is disposed in the susceptor. Also, there is a case in which a heating electrode for heating the plate sample by an electricity is disposed in the susceptor. Also, there is a case in which an inner electrode for generating a plasma by applying a high frequency electricity is disposed in the susceptor.

FIG. 6 is a cross section showing an example for such an electrode-built-in susceptor. Here, an electrode-built-in susceptor 1 comprises a mounting plate 2 which is formed by an aluminium-nitride-group-sintered-member of which upper surface is a mounting surface 2a for mounting a plate sample (not shown in the drawing) thereon, a supporting plate 3 which is formed by an aluminium-nitride-group-sintered-member for supporting the mounting plate 2 from therebeneath, a plurality of inner electrodes 4 which are supported between the mounting plate 2 and the supporting plate 3, and power supplying terminals 6, 6 which are disposed in a fixing holes 5 formed in the supporting plate 3 so as to contact the inner electrodes 4. These power supplying terminals 6, 6 are formed by a heat-resistance metal such as a molybdenum (Mo) and a tungsten (W).

In such an electrode-built-in susceptor 1, the mounting plate 2 and the supporting plate 3 for supporting the inner electrodes 4 are formed by an aluminium-nitride-group-sintered-member; therefore, such an electrode-built-in susceptor is used preferably in a plasma-etching-apparatus or a plasma CVD (chemical vapor disposition) apparatus in which an anti-plasma characteristics and a thermal conductivity are necessary particularly.

Here, the aluminum-nitride-group-sintered-member which forms the above mounting plate 2 and the supporting plate 3 is very insulating under an ordinary temperature condition. However, the insulating characteristics in the aluminum-nitride-group-sintered-member tends to worsen under a high temperature oxidizing condition such as 400° C. or higher. A resistance value in the mounting plate 2 and the supporting plate 3 become worsened if such an electrode-built-in susceptor 1 is used under a high temperature atmosphere condition; thus, a leak electricity may easily occurs when an electricity is charged to the inner electrodes 4. As a result, there are problems in that the leak electricity damages a plate sample which is mounted on the mounting surface, or it is not possible to control an electric conductivity to the inner electrodes 4 because of such a leak electricity.

Correspondingly, it is proposed recently to use an aluminium-nitride-group-sintered-member to which a magnesium compound such as a magnesium oxide (MgO) is doped so as to alleviate a temperature dependency of an initial volume resistance value in the aluminium-nitride-group-sintered-member. There is a problem in that a thermal efficiency is reduced because of a reduced thermal conductivity of the aluminium-nitride-group-sintered-member in such an electrode-built-in susceptor. In addition, there is a new problem in that a magnesium which is contained in the aluminium-nitride-group-sintered-member may be a contamination source for the plate sample.

On the other hand, it is necessary to apply a 20 A electricity when, for example, the inner electrodes 4 are used for a plasma generating electrodes under condition a large amount of electricity is applied to the inner electrodes 4 in the power supplying terminals 6, 6. Therefore, it is necessary to reduce the resistance value in the power supplying terminals 6, 6. As a result, it is necessary to increase a diameter of the power supplying terminal 6. Therefore, a stress becomes large which is caused by a difference between a thermal expansion in a heat-resistance metal which forms the power supplying terminals 6, 6 and a thermal expansion in the aluminium-nitride-group-sintered-member which forms the supporting plate 3. Thus, there is a problem in that a crack may occur easily on the supporting plate 3 according to a thermal condition change when such an electrode-built-in susceptor is used.

Here, recently, it is tentatively proposed to form power supplying terminals 6, 6 by a conductive sintered member such as an aluminium-nitride-tungsten-composite-sintered-member. However, such a sintered member does not have sufficient anti-oxidization characteristics. For example, there is a problem in that such a sintered member does not have a durability to a thermal cyclic load in which a heating operation and a cooling operation are repeated under 400° C. temperature oxidizing atmosphere condition.

In order to solve such a problem, it is proposed to cool the power supplying terminals 6, 6 by a cooling section. In such a case, another problem arises in that it takes more time to heat the plate sample at a predetermined temperature and the heat does not distribute in the plate sample uniformly.

SUMMARY OF THE INVENTION

The present invention is made in consideration of the above problems. An object of the present invention is to provide an electrode-built-in susceptor in which various problems are not caused by a leak electricity and a thermal efficiency is not worsened under a high temperature condition. Also, another object of the present invention is to provide an electrode-built-in susceptor which does not become a source for contaminating the plate sample under a high temperature oxidizing atmosphere condition.

The Inventor of the present invention found that it is possible to solve the above problems effectively by forming an insulating ceramic layer which is made of either one of a boron nitride, a lithium oxide, an aluminium oxide, or a magnesium oxide having a similar coefficient of thermal expansion to that in an aluminium nitride between a mounting surface on a susceptor base body which is made of an aluminium-nitride-group-sintered-member and inner electrodes which are built in the susceptor base body after a serious researches and developments; thus, the present invention is realized.

That is, an electrode-built-in susceptor is characterized in comprising:

a susceptor base body which is made of an aluminium-nitride-group-sintered-member on one of which surface a plate sample is mounted, an inner electrode which is built in the susceptor member, a power supplying terminal which is disposed in the susceptor base body so as to be attached to the inner electrode, and an insulating layer which is formed mainly by one of a boron nitride, a lithium oxide, an aluminium oxide, or a magnesium oxide is formed between the inner electrode and the mounting surface.

In this aspect of the electrode-built-in susceptor according to the present invention, an insulating layer which is formed mainly by one of a boron nitride, a lithium oxide, an aluminium oxide, or a magnesium oxide having a superior insulating characteristics and thermal conductivity and a similar coefficient of thermal expansion to that in an aluminium-nitride-group-sintered-member is formed between the inner electrode and the mounting surface. By doing this, the susceptor base body in such an electrode-built-in susceptor maintains a high resistance and prevents a leak electricity in an inner electrode under a high temperature oxidizing atmosphere condition. By doing this, it is possible to use such an electrode-built-in susceptor under a high temperature oxidizing atmosphere condition.

Also, an electrode-built-in susceptor according to the present invention is characterized in comprising a susceptor base body which is made of an aluminium-nitride-group-sintered-member on one of which surface a plate sample is mounted, a plurality of inner electrodes which are built in the susceptor member, a plurality of power supplying terminals which are disposed in the susceptor base body so as to be attached to each of a plurality of the inner electrodes, and an insulating layer which is formed mainly by one of a boron nitride, a lithium oxide, an aluminium oxide, or a magnesium oxide is formed between the inner electrode which is disposed the most closely to the mounting surface and the mounting surface, or between a pair of inner electrodes which neighbor each other among a plurality of the inner electrodes, or between the inner electrode which is disposed the most closely to the mounting surface and the mounting surface and between a pair of inner electrodes which neighbor each other among a plurality of the inner electrodes.

In this aspect of the present invention, an insulating layer which is mainly formed by one of a boron nitride, a lithium oxide, an aluminium oxide, or a magnesium oxide having a superior insulating characteristics and thermal conductivity and a similar coefficient of thermal expansion to that in an aluminium-nitride-group-sintered-member is formed between the inner electrode which is disposed the most closely to the mounting surface and the mounting surface, or between a pair of inner electrodes which neighbor each other among a plurality of the inner electrodes, or between the inner electrode which is disposed the most closely to the mounting surface and the mounting surface and between a pair of inner electrodes which neighbor each other among a plurality of the inner electrodes. By doing this, the susceptor base body in such an electrode-built-in susceptor maintains a high resistance and prevents a leak electricity in each of a plurality of inner electrodes under a high temperature oxidizing atmosphere condition. By doing this, it is possible to use such an electrode-built-in susceptor under a high temperature oxidizing atmosphere condition.

Here, in the present invention, it is defined that an aluminium-nitride-group-sintered-member is a composite-sintered-member which contains 50 weight % or higher of an aluminium-nitride-group-sintered-member or an aluminium nitride.

Also, an inner electrode can be used for an electrostatic chucking electrode for fixing the plate sample by using an electrostatic absorbing force which is caused by generating an electric charge, a heater electrode for heating the plate sample by a heat which is generated by an electricity, and a plasma-generating-electrode for generating a plasma for performing a plasma processing by flowing a high frequency electricity. It is possible to change the size and shape of the inner electrode preferably according to a purpose.

It may be acceptable if the power supplying terminal is formed by a conductive aluminium-nitride-tantalum-nitride-composite-sintered-member. Also, it may be acceptable if the power supplying terminal is provided with a first power supplying terminal which is connected to the inner electrode and formed by a conductive aluminium-nitride-tungsten-composite-sintered-member and a second power supplying terminal which is connected to the first power supplying terminal and formed by a conductive silicon-carbide-sintered-member a part of which is exposed from the susceptor base body.

By forming these power supplying terminal by a conductive composite-sintered-member, anti-oxidization characteristics is improved. Therefore, a power supplying terminal has a durability to a thermal cyclic load in which a heating operation and a cooling operation are repeated under 400° C. temperature oxidizing atmosphere condition. Also, it is not necessary to cool a periphery of these power supplying terminals; thus, there is not a concern that it takes a longer time for a heating temperature to reach at a predetermined temperature to heat the plate sample. Therefore, there is not a concerning that a heat distribution characteristics is not uniform in the plate sample.

According to the present invention, it is acceptable that a susceptor base body which is made of an aluminium-nitride-group-sintered-member on one of which surface a plate sample is mounted and a supporting plate which is formed by a aluminium-nitride-group-sintered-member for supporting the mounting plate from therebeneath, and the insulating layer is formed in the mounting plate.

By doing this, it is possible to dispose the insulating layer in a desirable position in the mounting plate easily. Thus, it is possible to enhance an insulation characteristics between the mounting surface and the inner electrode. Therefore, it is possible to prevent a leak electricity in the inner electrode. Also, it is possible to connect the power supplying terminal and the inner electrode reliably; thus, an electric conductivity can be improved more reliably.

In this aspect of the electrode-built-in susceptor according to the present invention, an insulating layer which is formed mainly by one of a boron nitride, a lithium oxide, an aluminium oxide, or a magnesium oxide is formed between the inner electrode and the mounting surface which are built in the susceptor base body. By doing this, it is possibe to prevent the leak electricity from flowing to the plate sample effectively; thus, there is not a concern that the plate sample is damaged. In addition, there is not a concern that thermal efficiency is reduced and such a leak electricity causes a contamination on the plate sample.

According to the other aspect of the electrode-built-in susceptor of the present invention, an insulating layer which is formed mainly by one of a boron nitride, a lithium oxide, an aluminium oxide, or a magnesium oxide is formed between the inner electrode which is disposed the most closely to the mounting surface and the mounting surface, or between a pair of inner electrodes which neighbor each other among a plurality of the inner electrodes, or between the inner electrode which is disposed the most closely to the mounting surface and the mounting surface and between a pair of inner electrodes which neighbor each other among a plurality of the inner electrodes. By doing this, it is possible to prevent the leak electricity from flowing to the plate sample effectively; thus, there is not a concern that the plate sample is damaged. In addition, there is not a concern that thermal efficiency is reduced and such a leak electricity causes a contamination on the plate sample.

Therefore, it is possible to the electrode-built-in susceptor under a high temperature oxidizing atmosphere condition.

When the power supplying terminal is formed by a conductive aluminium-nitride-tantalum-nitride-composite-sintered-member, it is possible to improve anti-oxidization characteristics under a high temperature condition; thus, it is possible to use the power supplying terminal under a high temperature oxidizing atmosphere condition.

When the power supplying terminal is provided with a first power supplying terminal which is connected to the inner electrode and formed by a conductive aluminium-nitride-tungsten-composite-sintered-member and a second power supplying terminal which is connected to the first power supplying terminal and formed by a conductive silicon-carbide-sintered-member a part of which is exposed from the susceptor base body, it is possible to improve anti-oxidization characteristics under a high temperature condition; thus, it is possible to use the power supplying terminal under a high temperature oxidizing atmosphere condition.

When the susceptor base body which is made of an aluminium-nitride-group-sintered-member on one of which surface a plate sample is mounted and a supporting plate which is formed by a aluminium-nitride-group-sintered-member for supporting the mounting plate from therebeneath, and the insulating layer is formed in the mounting plate, it is possible to dispose the insulating layer in a desirable position in the mounting plate easily. Thus, it is possible to enhance the insulation characteristics between the mounting surface and the inner electrode more reliably. As a result, it is possible to prevent a leak electricity in the inner electrode. Also, it is possible to connect the power supplying terminal and the inner electrode reliably; thus, an electric conductivity can be improved more reliably.

DETAILED DESCRIPTION OF THE INVENTION

Embodiments of the electrode-built-in susceptor according to the present invention are explained as follows.

Here, the following embodiments are referred so as to better explain the features of the present invention. It should be understood, however, that the drawings and detailed description thereto are not intended to limit the invention to the particular form disclosed.

First Embodiment

Figure 1:
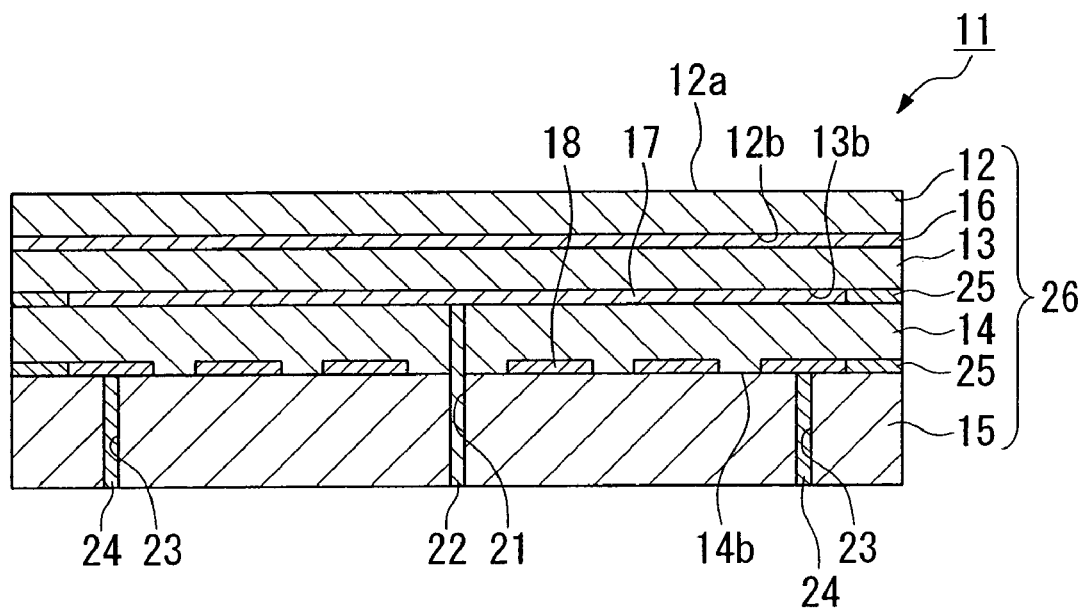
FIG. 1 is a cross section of an electrode-built-in susceptor according to a first embodiment of the present invention.

FIG. 1 is a cross section showing an electrode-built-in susceptor according to a first embodiment of the present invention.

An electrode-built-in susceptor 11 comprises a mounting plate 12 one of which upper surface (a main surface) surface is a mounting surface 12a on which a plate sample is mounted, a first intermediate plate 13 which is unitarily attached to a bottom surface 12b so as to be disposed beneath of the mounting plate 12 a second intermediate plate 14 which is unitarily attached to a bottom surface 13b so as to be disposed beneath the first intermediate plate 13, a supporting plate 15 which is unitarily attached to a bottom surface 14b so as to be disposed beneath the second intermediate plate 14 an insulating layer 16 which is formed between the mounting plate 12 and the first intermediate plate 13, an electrostatic chucking electrode 17 which is formed between the first intermediate plate 13 and the second intermediate plate 14, a heating internal electrode 18 which is formed between the second intermediate plate 14 and the supporting plate 15 an electrostatic absorbing power supplying terminal (power supplying terminal) 22 which is fixed in a fixing hole (through hole ) 21 which is formed in the second intermediate plate 14 and the supporting plate 15 so as to be attached to the an electrostatic absorbing internal electrode 17, and heating internal electrodes (power supplying terminals) 24, 24 which are attached to the heating internal electrode 18 so as to be fixed in the fixing holes (through holes) 23, 23.

Insulating layers 25 are formed around the electrostatic absorbing internal electrode 17 and the heating internal electrode 18.

In addition, the mounting plate 12 and the first intermediate plate 13 are attached together unitarily such that an insulating layer 16 is sandwiched therebetween. Also, the first intermediate plate 13 and the second intermediate plate 14 are attached together unitarily such that the electrostatic absorbing internal electrode 17 and the insulating layer 25 are sandwiched therebetween. Also, the second intermediate plate 14 and the supporting plate 15 are attached together unitarily such that the heating internal electrode 18 and the insulating layer 25 are sandwiched therebetween. By doing this, a susceptor base body 26 is formed by these mounting plate 12, the first intermediate plate 13, the second intermediate plate 14, and the supporting plate 15.

These mounting plate 12, the first intermediate plate 13, the second intermediate plate 14, and the supporting plate 15 are formed unitarily such that the mounting plate 12, the first intermediate plate 13, the second intermediate plate 14, and the supporting plate 15 have the same shape when attached together. Also, the mounting plate 12, the first intermediate plate 13, the second intermediate plate 14, and the supporting plate 15 are made of an aluminium-nitride (AlN)-group-sintered-member. The aluminium-nitride-group-sintered-member is not limited to a specific material. For example, a member which contains at least 50 weight % of aluminium-nitride can be used preferably. For such an aluminium-nitride-group-sintered-member for improving a sintering characteristics and an anti-plasma characteristics, it is possible to name an aluminium-nitride-group-sintered-member which contains at least one of material selected among yttrium oxide ($Y_2O_3$), lanthanum oxide ($La_2O_3$), calcium oxide (CaO), magnesium oxide (MgO), silicon carbide (SiC), and titanium oxide ($TiO_2$) such that the weight % in the aluminium-nitride-group-sintered-member is 0.1 to 10.0 weight %. Also, it is possible to name an aluminium-nitride-silicon-carbide-composite-sintered-member which contains the silicon carbide such that the weight % of the silicon carbide in the aluminium-nitride-silicon-carbide-composite-sintered-member is not more than 50 weight %.

For example, it is preferable that the mounting plate 12 does not contain a contamination source such as a magnesium (Mg) for a plate sample. Otherwise, if such a contamination source is contained, such a contamination source should be minimum. In particular, it is preferable that any member which may become a contamination source is not exposed on the mounting surface 12a.

The insulating layer 16 is mainly formed by one of a boron nitride (BN), a lithium oxide ($Li_2O$), an aluminium oxide ($Al_2O_3$), or a magnesium oxide (MgO) having a superior insulating characteristics and thermal conductivity and a similar coefficient of thermal expansion to that in an aluminium-nitride-group-sintered-member which forms the mounting plate 12 and the first intermediate plate 13. Here, a member "mainly formed by one of a boron nitride (BN), a lithium oxide ($Li_2O$), an aluminium oxide ($Al_2O_3$), or a magnesium oxide (MgO)" is defined as a member which contains at least one of these members by 70 weight % or more.

These material have high resistance under a high temperature condition; thus, the insulation characteristics is high in these material. Also, there is not a concern that an excessive electricity flows in these material under a high temperature condition in which a resistance in the aluminium-nitride-group-sintered-member decreases.

Also, these material have a superior thermal conductivity; therefore, there is not a concern that a thermal conductivity deteriorates if these material is used between the mounting surface 12a and the electrostatic absorbing internal electrode 17.

Also, these materials have a similar coefficient of thermal expansion to that in an aluminium nitride; therefore, there is not a concern that the electrode-built-in susceptor is broken by a thermal stress in a heating operation in a manufacturing process for the electrode-built-in susceptor. In addition, these material has a sufficient durability to a thermal cyclic load in which a heating operation and a cooling operation are repeated under 400° C. temperature oxidizing atmosphere condition.

Among the above insulating materials, a boron-nitride (BN) has a superior characteristics for a material for forming the insulating layer for the present invention from an insulation, thermal conductivity, and a coefficient of thermal expansion point of view.

It is preferable that the insulating layer 16 has 10 μm to 100 μm thickness because there is a concern that it is not possible to prevent the leak electricity effectively if the thickness of the insulating layer is no more than 10 μm and a cracking occurs because of a coefficient of thermal expansion difference or a thermal conductivity decreases if the thickness of the insulating layer exceeds 100 μm.

The material which is used for the above electrostatic absorbing internal electrode 17 and the heating internal electrode 18 is not limited particularly. For example, it is preferable to use a conductive aluminium-nitride (AlN)-tantalum-nitride (TaN)-composite-sintered-member or a conductive aluminium-nitride (AlN)-tungsten (W)-composite-sintered-member.

For the above aluminium-nitride-tantalum-nitride-composite-sintered-member, it is preferable that a tantalum-nitride is contained in the aluminium-nitride-tungsten-composite-sintered-member by 50 to 98 weight % and the rest of the weight % is formed by an aluminium-nitride. Here, a tantalum-nitride is contained in the aluminium-nitride-tungsten-composite-sintered-member by 50 to 98 weight % because an inner electrodes 16, 17 do not work properly if the weight % is lower than 50 weight %; thus a resistance in the inner electrodes 16, 17 increase. Also, an inner electrodes 16, 17 do not work properly if the weight % is higher than 98 weight %; thus a coefficient of thermal expansion becomes greater than that in the aluminium-nitride-group-sintered-member which forms the mounting plate 12, the intermediate plates 13, 14 and the supporting plate 15. Therefore, there is a concern that a thermal stress destruction may occur in a heating process under compressed condition thereafter.

By limiting the weight % of the tantalum-nitride as the above manner, therefore, there is not a concern that a thermal stress destruction may occur in a heating process under compressed condition thereafter. Furthermore, a sintered member has a durability to a thermal cyclic load in which a heating operation and a cooling operation are repeated when the electrode-built-in susceptor is in use.

For the above aluminium-nitride-tungsten-composite-sintered-member, it is preferable that a tungsten is contained in the aluminium-nitride-tungsten-composite-sintered-member by 58 to 80 weight % and the rest of the weight % is formed by an aluminium-nitride. Here, a tungsten is contained in the aluminium-nitride-tungsten-composite-sintered-member by 58 to 80 weight % is because an inner electrodes 16, 17 do not work properly if the weight % is lower than 58 weight %; thus a resistance in the inner electrodes 16, 17 increase. Also, if the weight % of the tungsten in the aluminium-nitride-tungsten-composite-sintered-member exceeds 80 weight %, thus a coefficient of thermal expansion in the inner electrodes 17, 18 becomes greater than that in the aluminium-nitride-group-sintered-member which forms the mounting plate 12, the intermediate plates 13, 14 and the supporting plate 15. Therefore, there is a concern that a thermal stress destruction may occur in a heating process under compressed condition thereafter.

By limiting the weight % of the tungsten as the above manner, therefore, there is not a concern that a thermal stress destruction may occur in a heating process under compressed condition thereafter. Furthermore, a sintered member has a durability to a thermal cyclic load in which a heating operation and a cooling operation are repeated when the electrode-built-in susceptor is in use.

The insulating layer 25 is formed so as to improve an insulation characteristics, an anti-corrosion characteristics, and an anti-plasma characteristics in the electrostatic absorbing internal electrode 17 and the heating internal electrode 18. For a material for the insulating layer 25, it is preferable to use an aluminium-nitride-group-sintered-member or an aluminium-nitride-group-composite-sintered-member having an aluminium-nitride as a main ingredient.

An electrostatic absorbing power supplying terminal 22 is disposed so as to supply an electricity to the electrostatic absorbing internal electrode 17 from thereoutside. Factors such as a quantity, shape, and disposition of the electrostatic absorbing power supplying terminal 22 is determined by which of the single pole electrostatic chuck or a bipolar electrostatic chuck is selected.

Also, the heating power supplying terminal 24 is disposed so as to supply an electricity to the heating internal electrode 18 from thereoutside. Factors such as a quantity, shape, and disposition of the heating power supplying terminal 24 is determined by a heater to be used.

These An electrostatic absorbing power supplying terminal 22 and the heating power supplying terminal 24 are made of a conductive aluminium-nitride (AlN)-tantalum-nitride (TaN)-composite-sintered-member. Such a power supplying terminal can be called a single power supplying terminal, too.

Here, it is preferable that 50 to 98 weight % of the tantalum-nitride (TaN) in the aluminium-nitride-tantalum-nitride-composite-sintered-member is contained in the electrostatic absorbing power supplying terminal 22 and the heating power supplying terminal 24. By controlling a composition in the composite-sintered-member in the above manner, it is possible to alleviate a thermal stress which is caused by a difference of coefficient of thermal expansion between the members which is used in the processes for manufacturing the susceptor. By doing this, the power supplying terminal 22 (24, 24) are connected to the inner electrodes 16, 17 reliably; thus, the electric conductivity can be further improved.

It is preferable that these power supplying terminals 22, 24, 24 are formed in a columnar shape having 2 to 10 mm of diameter. That is because the power supplying terminals 22, 24, 24 do not have sufficient resistance if a diameter of the power supplying terminal is smaller than 2 mm. In addition, in such a case, there is unfavorably a concern that a heat is generated when an electricity is applied. Also, there is a concern that the power supplying terminals 22, 24, 24 may unfavorably be broken due to a difference of a coefficient of thermal stress among these members for forming the susceptor base body 26 if a diameter of the power supplying terminals 22, 23, 24 exceeds 10 mm.

Figure 2:
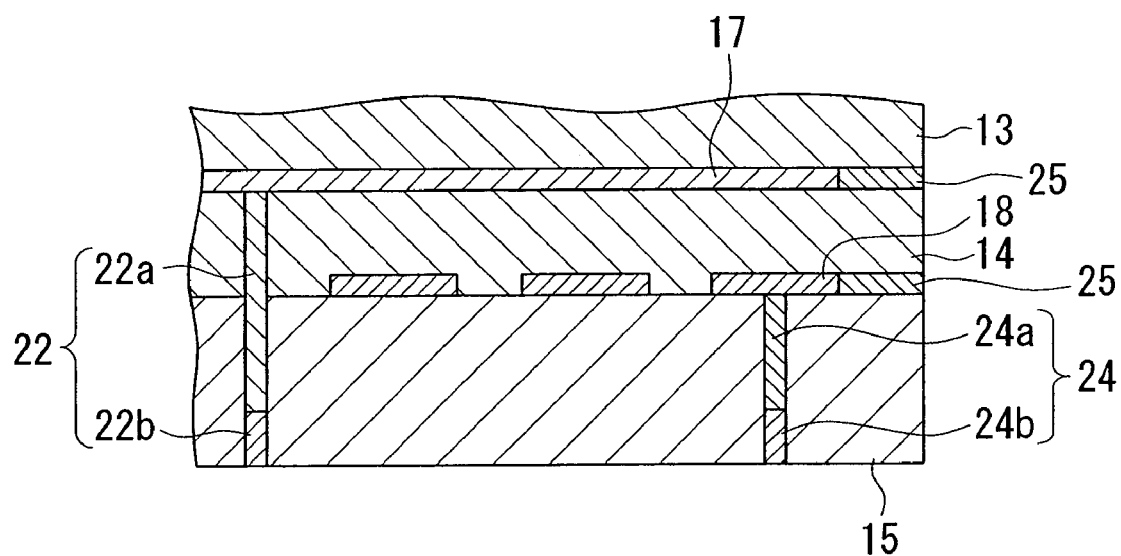
FIG. 2 is a cross section of a modified example of an electrode-built-in susceptor according to the first embodiment of the present invention.

As shown in FIG. 2, these power supplying terminal 22, 24, 24 may be composite power supplying terminals made by forming a plurality of materials.

The electrostatic absorbing power supplying terminal 22 are formed by an upper power supplying terminal (first power supplying terminal) 22a made of a conductive. aluminium-nitride (AlN)-tungsten (W)-composite-sintered-member so as to be attached to the electrostatic absorbing internal electrode 17 and a lower power supplying terminal (second power supplying terminal) 22b made by a conductive silicon carbide (SiC) sintered member one end of which is attached to the upper power supplying terminal 22a and other end (a part) of which is exposed from a bottom surface of the supporting plate 15.

Also, the heating power supplying terminals 24, 24 are formed by an upper power supplying terminal (first power supplying terminal) 24a made of a aluminium-nitride (AlN)-tungsten (W)-composite-sintered-member so as to be attached to the heating power supplying terminal 18 and a lower power supplying terminal (second power supplying terminal) 24b having a superior durability under a high temperature oxidizing condition made by a conductive silicon carbide (SiC) sintered member one end of which is exposed from a bottom surface of the supporting plate 15.

These upper power supplying terminals 22a, 24a, 24a are handled under an air-tight condition by the lower power supplying terminals 22b, 24b, 24b which are made of a silicon carbide sintered member so as to be built in the susceptor main body 26 such that the upper power supplying terminals 22a, 24a, 24a are not exposed to an outer space. Therefore, the electrode-built-in susceptor 11 has a superior durability under a high temperature oxidizing atmosphere condition.

These conductive aluminium-nitride-tungsten-composite-sintered-member are made by heating a mixture of the powder of an aluminium-nitride (AlN) and a tungsten (W) powder under a compressed condition. Here, it is preferable that 50 to 98 weight % of the tungsten powder is contained in the obtained aluminium-nitride-tungsten-composite-sintered-member.

By controlling a composition in the aluminium-nitride-tungsten-composite-sintered-member in the above manner, it is possible to alleviate a thermal stress which is caused by a difference of coefficient of thermal expansion between the members which is used in the processes for manufacturing the susceptor.

It is preferable that the upper power supplying terminals 22a, 24a, 24a and the lower power supplying terminals 22b, 24b, 24b are formed in a columnar shape having 2 to 10 mm of diameter. That is because these power supplying terminals do not have sufficient resistance if a diameter of the power supplying terminal is smaller than 2 mm. In addition, in such a case, there is unfavorably a concern that a heat is generated when an electricity is applied. Also, there is a concern that these power supplying terminals may unfavorably be broken due to a difference of a coefficient of thermal stress among these members for forming the susceptor base body 26 if a diameter of these power supplying terminals exceeds 10 mm.

It is preferable that the thickness of the lower power supplying terminals 22b, 24b, 24b is 0.1 to 2.5 mm. That is because the lower power supplying terminals may unfavorably be broken due to a difference of a coefficient of thermal stress among these members for forming the susceptor base body 26 if a thickness of the lower power supplying terminals is lower than 0.1 mm. Also, that is because the supporting plate 15 may unfavorably be broken easily due to a difference of a coefficient of thermal stress among these members for forming the susceptor base body 26 if a thickness of the lower power supplying terminals exceeds 2.5 mm.

Next, a method for manufacturing an electrode-built-in susceptor according to the present invention is explained with reference to FIGS. 3A to 4B.

First, a supporting plate 15, a second intermediate plate 14, a first intermediate plate 13, and a mounting plate 12 which are made of an aluminium-nitride-group-sintered-member are produced according to an ordinary manufacturing method.

Figure 3A:
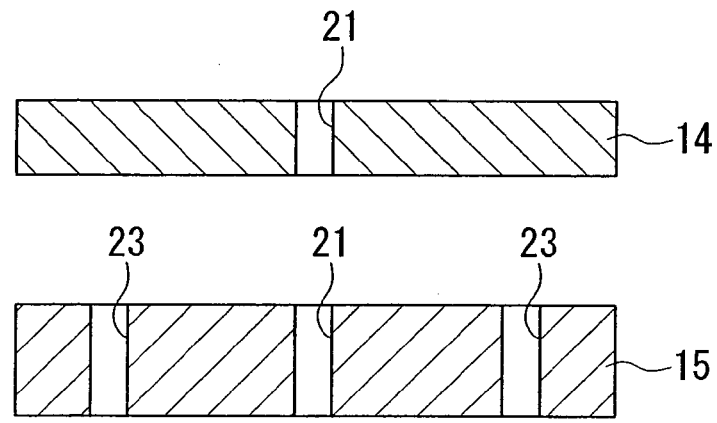
FIGS. 3A to 3D show processes for manufacturing an electrode-built-in susceptor according to the first embodiment of the present invention.

Next, as shown in FIG. 3A, a fixing hole (through hole) 21 for assembling the electrostatic absorbing power supplying terminal 22 so as to fix therein and fixing holes (through holes) 23, 23 for assembling the heating power supplying terminals 24, 24 so as to fix therein are formed in the supporting plate 15. Also, a fixing hole (through hole) 21 for assembling the electrostatic absorbing power supplying terminal 12 so as to fix therein is formed in the second intermediate plate 14.

There is not a limit for a method for forming the fixing holes 21, 23, 23 in particular. For example, various methods can be employed such as a method in which a diamond drill is used, a method using a laser, an electric discharging method, and a method using a supersonic wave. Here, the fixing hole can be acceptable as long as an ordinary accuracy is obtained under condition that the product yield is approximately 100%. Here, the position and quantity of the fixing hole 21 are determined by factors in the electrostatic absorbing internal electrode 17 such as the shape, disposition, and quantity of the electrostatic absorbing internal electrode 17. Also, the position and quantity of the fixing holes 23, 23 are determined by factors in the heating internal electrode 18 such as the shape, disposition, and quantity of the heating internal electrode 18.

Figure 3B:
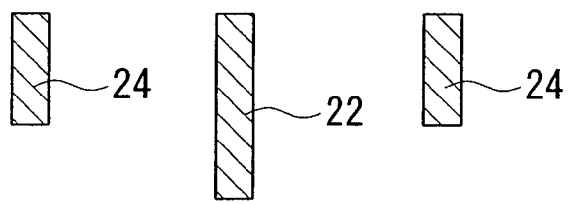

Next, as shown in FIG. 3B, the electrostatic absorbing power supplying terminal 22 is produced such that the electrostatic absorbing power supplying terminal 22 can be fixed in the fixing hole 21 in the supporting plate 15 and in the fixing hole 21 in the second intermediate plate 14. Also, the heating power supplying terminal 24 is produced such that the heating power supplying terminal 24 can be fixed in the fixing holes 23, 23 which are formed in the supporting plate 15.

Here, electrostatic absorbing power supplying terminals 22, 22 and heating electrode power supplying terminals 24, 24 may be either of a single power supplying terminal or a combined power supplying terminal.

For example, power supplying terminals 22, 24, 24 may be formed by a single power supplying terminal by mixing an aluminium-nitride (AlN) power and a tantalum-nitride (TaN) powder and sintering the mixture under a compressed condition.

Also, power supplying terminals 22, 24, 24 may be produced as follows. First, upper power supplying terminals 22a, 24a, 24a are formed by mixing and an aluminium-nitride (AlN) powder and a tungsten (W) powder and sintering the mixture under a compressed condition. Next, a lower power supplying terminals 22b, 24b, 24b is produced according to either one of methods (1) or (2) which are disclosed in a document such as Japanese Unexamined Patent Application, First Publication No. Hei 4-65361. A silicon-carbide-sintered-member which is produced according to the above method has a high electric conductivity such as 1 Ω·cm resistance or lower; thus, such a silicon-carbide-sintered-member is preferable.

(1) A first silicon-carbide powder having 0.1 to 10 μm average grain diameter and a second silicon-carbide powder having 0.1 μm or lower average grain diameter are mixed. The mixture is molded and heated by using an apparatus such as a hot-press under a compressed condition; thus a silicon-carbide-sintered-member is produced in a predetermined shape.

The second silicon-carbide powder can be synthesized by introducing a material gas which is made by a silane compound or a mixture of a silicon-halogenide and a hydrocarbon in a plasma in a non-oxidizing atmosphere and performing an epitaxial-vapor-deposition while controlling a pressure in a reacting system in a range of 1 MPa to 0.1 torr.

(2) A silicon-carbide powder having an average grain diameter 0.1 μm or lower is synthesized by introducing a material gas which is made of a silane compound or a mixture of a silicon-halogenide and a hydrocarbon in a non-oxidizing atmosphere plasma and performing an epitaxial-vapor-deposition while controlling a pressure in a reacting system in a range of 1 MPa to 0.1 torr. Such a silicon-carbide powder is heated by using an apparatus such as a hot press; thus, a silicon-carbide-sintered-member is produced in a predetermined shape.

Figure 3C:
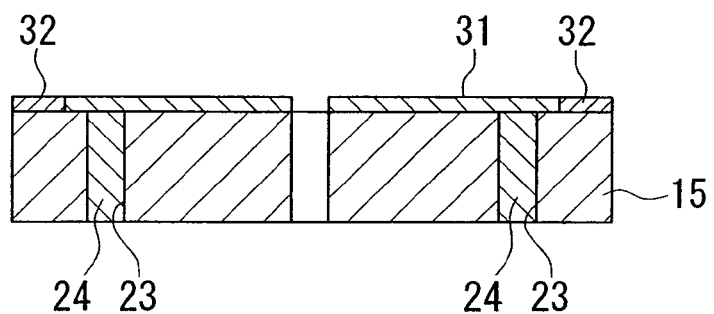

Next, as shown in FIG. 3C, these heating power supplying terminals 24, 24 are formed in the fixing holes 23, 23 formed in the supporting plate 15 respectively.

Next, heating electrode inner electrode forming layer 31 is formed by applying a member for forming an inner electrode which is made of an organic solvent such as an ethyl alcohol in which a conductive powder such as a conductive aluminium-nitride-tantalum-nitride-composite-sintered-member or a aluminium-nitride-tungsten-composite-sintered-member are dispersed in a predetermined area on a predetermined surface of the supporting plate 15 such that the inner electrode forming member contacts the heating electrode power supplying terminals 24, 24 and drying the supporting plate 15.

For a method for applying the heating electrode inner electrode forming member, it is preferable to use a screen printing method or the like because it is necessary to apply the heating electrode inner electrode forming member in a uniform thickness.

Next, a member for forming an insulating layer which is made by dispersing an aluminium-nitride-group powder material which mainly contains an insulating powder such as an aluminium-nitride powder material or an aluminium-nitride in an organic solvent such as an ethyl alcohol is applied around a heating electrode inner electrode forming layer 31 which is formed on a surface of the supporting plate 15 and drying the supporting plate 15; thus, an insulating layer forming layer 32 is formed.

Figure 3D:
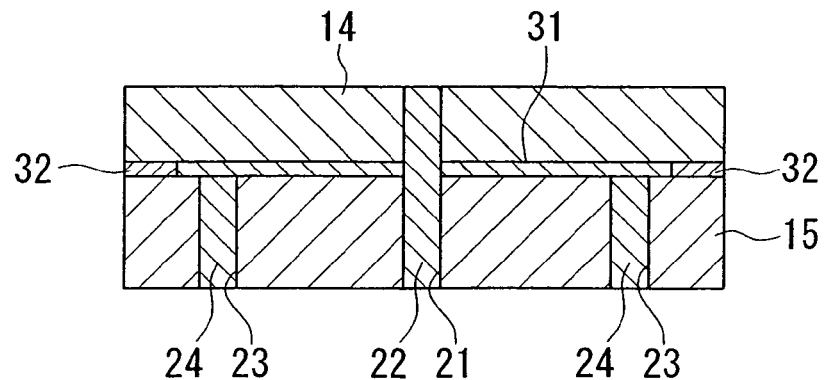

Next, as shown in FIG. 3D, an electrostatic absorbing power supplying terminals 22, 22 are disposed so as to fit in the fixing holes 21 which are formed on the supporting plate 15 on which a heating electrode inner electrode forming layer 31 and an insulating layer 32 are formed. After the, a second intermediate plate 14 is disposed on the heating electrode inner electrode forming layer 31 and the insulating layer 32.

Figure 4A:
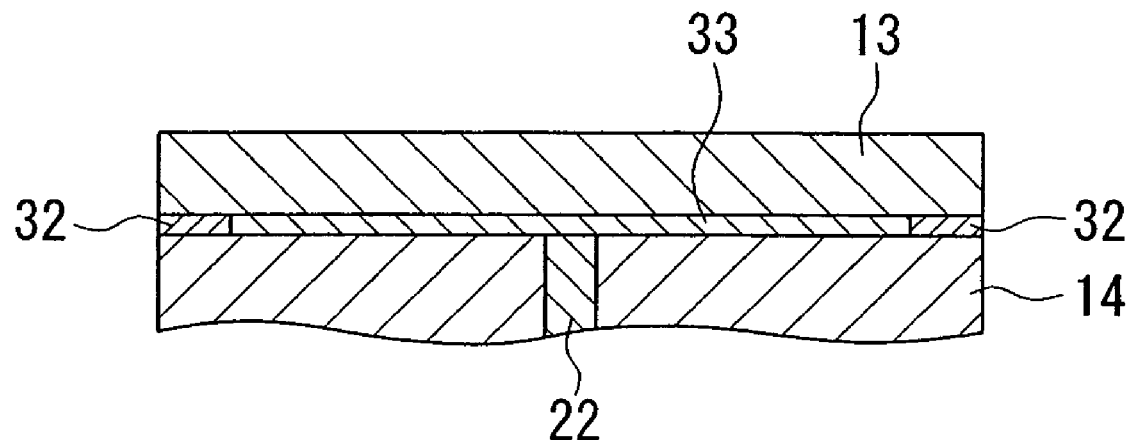
FIGS. 4A and 4B show processes for manufacturing an electrode-built-in susceptor according to the first embodiment of the present invention.

Next, as shown in FIG. 4A, an electrostatic absorbing inner electrode forming layer 33 is formed by applying a member for forming an inner electrode which is made of an organic solvent such as an ethyl alcohol in which a conductive powder such as a conductive aluminium-nitride-tantalum-nitride-composite-sintered-member or a aluminium-nitride-tungsten-composite-sintered-member are dispersed in a predetermined area on a predetermined surface of the second intermediate plate 14 such that the electrostatic absorbing power supplying terminals 22, 22 and drying the second intermediate plate 14. For a method for applying the heating electrode inner electrode forming member, it is preferable to use a screen printing method or the like because it is necessary to apply the heating electrode inner electrode forming member in a uniform thickness.

Next, a member for forming an insulating layer which is made by dispersing an aluminium-nitride-group powder material which mainly contains an insulating powder such as an aluminium-nitride powder material or an aluminium-nitride in an organic solvent such as an ethyl alcohol is applied around a electrostatic absorbing inner electrode forming layer 33 which is formed on a surface of the second intermediate plate 14 and drying the second intermediate plate 14; thus, an insulating layer forming layer 32 is formed.

Next, a first intermediate plate 13 is disposed on the electrostatic absorbing inner electrode forming layer 33 and the insulating layer forming layer 32.

Figure 4B:
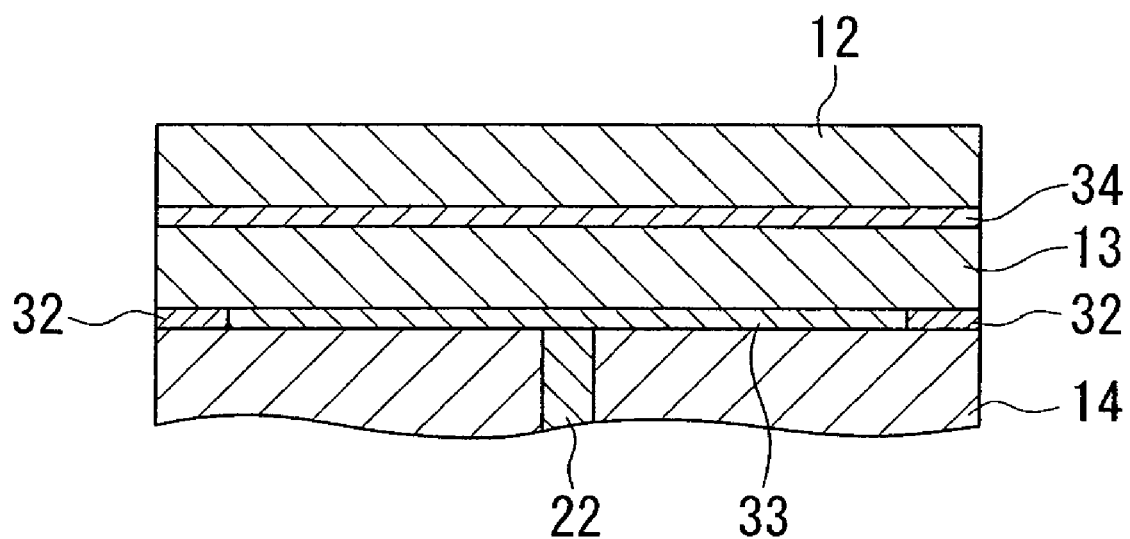

Next, as shown in FIG. 4B, an insulating layer forming layer 34 is formed by applying an insulating layer forming member which is made by dispersing either one of a boron-nitride (BN), a lithium-oxide ($Li_2O$), an aluminium-oxide ($Al_2O_3$), or a magnesium-oxide (MgO) in an organic solvent such as an ethyl alcohol in a predetermined area on a surface of the first intermediate plate 13 and by drying the first intermediate plate 13. For a method for applying the insulating layer forming member, it is preferable to use a screen printing method or the like because it is necessary to apply the insulating layer forming member in a uniform thickness.

Next, a mounting plate 12 is disposed on the insulating layer forming layer 34.

Next, a member which is obtained in the above operation is heated under a compressed condition so as to be unitarily attached together each other. By doing this, according to such a method in the present invention, a susceptor base body is unitarily formed only by a heating process under a compressed condition without disposing a bonding agent between members which form the susceptor main body 26.

For such a heating process, an inert processing atmosphere such as a vacuum atmosphere, argon atmosphere (Ar), a helium atmosphere (He), a nitrogen atmosphere (N2) is preferable. In particular, in order to restrict a decomposition of an aluminium-nitride, an $N_2$ atmosphere is preferable. Also, for a compressing condition, 5 to 10 MPa of compressing force is preferable. Also, 1600 to 1850° C. of heating temperature is preferable.

By performing such a heating process, the heating electrode inner electrode forming layer 31 which is formed on the supporting plate 15 is heated so as to become a heating electrode inner electrode 18. Also, the insulating layer forming layer 32 is heated so as to become an insulating layer 25. Also, the electrostatic absorbing inner electrode forming layer 33 which is formed on the second intermediate plate 14 is heated so as to become an electrostatic absorbing inner electrode 17. Also, the insulating layer forming layer 32 is heated so as to become an insulating layer 25. Also, an insulating layer forming layer 34 which is formed on the first intermediate plate 13 is heated so as to become an insulating layer 16.

As explained above, according to an electrode-built-in susceptor of the present invention, an insulating layer 16 which is mainly formed by either one of the boron-nitride (BN), a lithium-oxide ($Li_2O$), an aluminium-oxide ($Al_2O_3$), or a magnesium-oxide (MgO) having a similar coefficient of thermal expansion to that of the aluminium-nitride-group-sintered-member which forms the mounting plate 12 and the first intermediate plate 13 between the mounting plate 12 and the first intermediate plate 13. Therefore, it is possible to maintain a high resistance in the susceptor main body 26 even if the electrode-built-in susceptor 26 is used under a high temperature oxidizing condition. Thus, it is possible to prevent a leak electricity in the inner electrode 17.

Also, according to the electrode-built-in susceptor of the present embodiment, the power supplying terminals 22, 24, 24 are formed by a conductive aluminium-nitride-tantalum-nitride-composite-sintered-member or by combining upper power supplying terminals 22a, 24a, 24a which are made of a conductive aluminium-nitride-tungsten-composite-sintered-member so as to be attached to the inner electrodes and lower power supplying terminals 22b, 24b, 24b which is made of a conductive silicon-carbide-sintered-member a part of which is exposed from the susceptor base body 26 so as to be attached to the upper power supplying terminals 22a, 24a, 24a. Thus, it is possible to enhance an anti-oxidization characteristics under a high temperature condition. Therefore, it is possible to use the electrode-built-in susceptor under a high temperature oxidizing condition.

Second Embodiment

Figure 5:
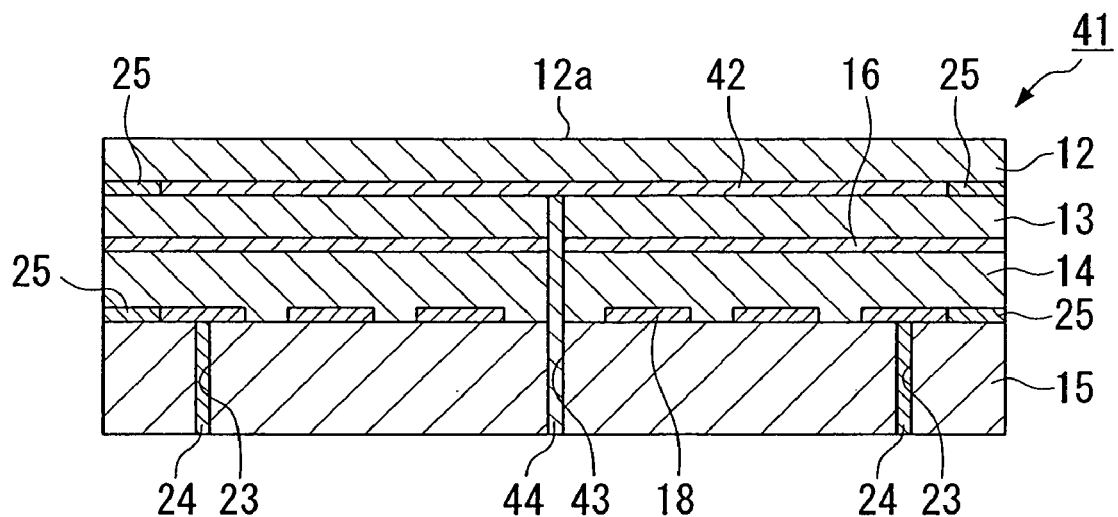
FIG. 5 is a cross section of an electrode-built-in susceptor according to a second embodiment of the present invention.
Figure 6:
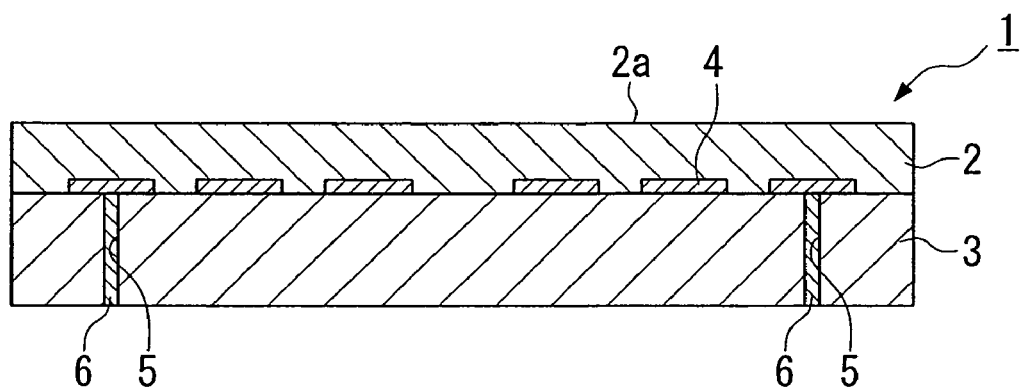
FIG. 6 is a cross section of a conventional electrode-built-in susceptor.

FIG. 5 is a cross section of an electrode-built-in susceptor 41 according to a second embodiment of the present invention. The electrode-built-in susceptor 41 is different from the electrode-built-in susceptor 11 according to the first embodiment as follows. That is, in the electrode-built-in susceptor 11 according to the first embodiment, an insulating layer 16 is formed between the mounting plate 12 and the first intermediate plate 13, an electrostatic absorbing inner electrode 17 is formed on a bottom surface of the first intermediate plate 13, and an electrostatic absorbing power supplying terminal 22 is attached to the electrostatic absorbing inner electrode 17. In contrast, a plasma generating inner electrode 42 and an insulating layer 25 are formed between the mounting plate 12 and the first intermediate plate 13, an insulating layer 16 is formed between the first intermediate plate 13 and the second intermediate plate 14, and plasma generating power supplying terminals (power supplying terminals) 44 are fixed in the fixing holes (through holes) 43 which are formed in the first intermediate plate 13, the second intermediate plate 14, and the supporting plate 15 in the electrode-built-in susceptor 41 according to the present embodiment.

It is possible to produce such an electrode-built-in susceptor 41 according to a manufacturing method for an electrode-built-in susceptor which is described in the first embodiment.

In the electrode-built-in susceptor 41, a leak electricity which leaks from a high voltage electricity which is applied to the plasma generating inner electrode 42 is blocked by the insulating layer 16. Therefore, it is possible to prevent the leak electricity from flowing to the heating inner electrode 18. Therefore, it is possible to solve a problem in that it is not possible to control an electric conductivity for the heating inner electrode 18.

EXAMPLE

The present invention is described in more detail with reference to following examples.

Example 1

An electrode-built-in susceptor according to the first embodiment is manufactured as follows.

Producing a Power Supplying Terminal 30 weight part of an aluminium-nitride powder (average grain diameter: 0.6 µm, product of Tokuyama Corp.), 70 weight part of a tantalum-nitride powder (average grain diameter: 3.4 µm, product of Nihon New Metals Co., Ltd.), and 100 weight part of isopropyl alcohol are mixed. Furthermore, the mixture is dispersed uniformly by using a planetary ball mill; thus, a slurry is obtained.

Alcohol portion is removed from the slurry by a method of absorption filtering operation and the slurry is dried. Thus, an aluminium-nitride-tantalum-nitride-composite-sintered-member is obtained.

Consequently, the aluminium-nitride-tantalum-nitride-composite-sintered-powder is put in a mold and sintered. Thus, a conductive columnar aluminium-nitride-tantalum-nitride-composite-sintered-member having 2.5 mm diameter and 7.0 mm length is obtained so as to be used as an electrostatic absorbing power supplying terminal 22.

Also, the aluminium-nitride-tantalum-nitride-composite-sintered-powder is put in a mold and sintered. Thus, a conductive columnar aluminium-nitride-tantalum-nitride-composite-sintered-member having 2.5 mm diameter and 5.0 mm length is obtained so as to be used as a heating power supplying terminal 24.

Here, a sintering operation is according to a compressing sintering method by using a hot-press apparatus. Conditions for the sintering operation are such as 1750° C. of sintering temperature and 20 MPa compressing force. Here, a relative density of the sintered aluminium-nitride-tantalum-nitride-composite-sintered-member is 99% or higher.

Producing a Supporting Plate 97 weight part of the above aluminium-nitride powder, 1.4 weight part of a yttrium oxide powder (average grain diameter: 1.4 μm, product of Nihon Yttrium Co., Ltd.), and 100 weight part of isopropyl alcohol are mixed. Furthermore, the mixture is dispersed uniformly by using a planetary ball mill; thus, an aluminium-nitride group powder is obtained from the slurry according to a method which is employed in the above paragraphs "Producing a power supplying terminal". After that, the aluminium-nitride-group powder is put in a mold and sintered. Thus, a circular aluminium-nitride-group-sintered-member having 230 mm diameter and 5.0 mm thickness is obtained. Here, a sintering operation is the same as that employed in paragraphs "Producing a power supplying terminal".

Consequently, the fixing holes 23, 23 through which the heating power supplying terminals 24, 24 are put through and fixed and a fixing hole 21 for fixing the electrostatic absorbing power supplying terminal 22 are formed on the aluminium-nitride-group-sintered-member according to a method for making holes by a diamond drill; thus, a supporting plate 15 which is made of an aluminium-nitride-group-sintered-member is obtained.

Producing a Mounting Plate

A circular aluminium-nitride-group-sintered-member having 230 mm diameter and 5 mm thickness is obtained according to a method described in the above paragraphs "Producing a supporting plate". Next, a main surface (a surface for mounting a plate sample thereon) of the circular aluminium-nitride-group-sintered-member is polished such that a surface finish is as fine as 10 μm flatness; thus a mounting plate 12 which is made of a aluminium-nitride-group-sintered-member is obtained.

Producing an Intermediate Plate

A circular aluminium-nitride-group-sintered-member having 230 mm diameter and 1 mm thickness is obtained according to a method described in the above paragraphs "Producing a mounting plate"; thus, a first intermediate plate 13 which is formed by an aluminium-nitride-group-sintered-member is produced.

Also, circular aluminium-nitride-group-sintered-member having 230 mm diameter and 2 mm thickness is obtained according to a method described in the above paragraphs "Producing a mounting plate"; thus, a second intermediate plate 14 which is formed by an aluminium-nitride-group-sintered-member is produced.

A fixing hole 21 is formed in the second intermediate plate 14 according to a method which is described in the above paragraph "producing the supporting plate" so as to fix the electrostatic absorbing power supplying terminal 22 therethrough.

Unitary Attaching Operation

The heating power supplying terminals 24, 24 which are formed according to the above method are pushed in the fixing holes 23, 23 which are formed on the above supporting plate 15 so as to be fixed there. Next, the member for forming the heating inner electrode 18 having 50 μm thickness in a later heating process under a compressed condition which is made of an aluminium-nitride-tantalum-nitride-composite-sintered-member having 30 weight % of an aluminium-nitride powder and 70 weight % of a tantalum-nitride powder¥ is applied on the supporting plate 15 on which heating power supplying terminals 24, 24 are put through and fixed there according to a screen printing method. These members are dried; thus, a spiral heating inner electrode forming layer 31 is obtained.

Furthermore, a liquid to be applied having 70 weight % of an aluminium-nitride-group powder and the rest of the weight % of ethyl alcohol is applied in an area except the heating inner electrode forming layer 31 on the supporting plate 15 according to a screen printing method. The supporting plate 15 is dried; thus, an insulating layer 32 is formed.

Next, the second intermediate plate 14 is layered on the supporting plate 15 and the electrostatic absorbing power supplying terminals 22 are pushed in the fixing holes 21 formed in the layered member and fixed such that the second intermediate plate 14 surrounds the heating electrode inner electrode forming layer 31 and the insulating layer 32. Next, a member which is made of an aluminium-nitride-tantalum-nitride-composite-sintered-member having 28 weight % of an aluminium-nitride and 72 weight % of a tantalum-nitride powder which become a bi-polar circular electrostatic absorbing inner electrode 17 having 25 μm thickness and 200 mm diameter in a later thermal process under a compressed condition according to a screen printing method is applied on the second intermediate plate 14. The supporting plate 15 is dried; thus, an electrostatic absorbing inner electrode forming layer 33 is formed. Also, a liquid having 70 weight % of an aluminium-nitride-group powder and the rest of the weight % of ethyl alcohol is applied in an area except the electrostatic absorbing inner electrode forming layer 33 on the second intermediate plate 14 by a screen printing method. The second intermediate plate 14 is dried; thus, an insulating layer 32 is obtained.

Next, a first intermediate plate 13 is layered on the second intermediate plate 14 such that the first intermediate plate 15 surrounds the electrostatic absorbing inner electrode forming layer 33 and the insulating layer 32. Next, a member which is made of 40 weight % of a boron-nitride (average grain diameter 50 μm: a product of DENKI KAGAKU KOGYO KABUSHIKI KAISHA) and the rest of the weight % of ethyl alcohol which become a circular insulating layer 16 having 50 μm thickness and 230 mm diameter in a later thermal process under a compressed condition according to a screen printing method is applied on the first intermediate plate 13. The layered member is dried; thus, an insulating layer 34 is formed.

Next, a mounting plate 12 is layered on the first intermediate plate 13 such that the mounting pate 12 surrounds the insulating layer 34 and a ground surface of the mounting plate 12 is disposed upwardly. The mounting plate 12 is thermally processed under a compressed condition by using an apparatus such as a hot press so as to attache the layered member unitarily together. Thus, the electrode-built-in susceptor according to the first example is produced. Above thermal process by using a hot press is performed under condition of 1700° C., and 7.5 MPa compressing force.

Example 2

An electrode-built-in susceptor for an example 2 is produced according to a method which is described in the example 1. Here, an electrostatic absorbing power supplying terminal 22 are formed by an upper power supplying terminal 22a and a lower power supplying terminal 22b. Also, a heating electrode power supplying terminal 24 is formed by an upper power supplying terminal (a first power supplying terminal) 24a and a lower power supplying terminal 24b. Also, the upper power supplying terminals 22a, 24a, 24a are pushed in the fixing holes 21, 23, 23. Consequently, the lower power supplying terminals 22b, 24b, 24b are pushed and fixed there.

The upper power supplying terminals 22a, 24a, 24a and the lower power supplying terminals 22b, 24b, 24b are produced as follows.

Producing an Upper Power Supplying Terminal 28 weight % of an aluminium-nitride powder, 72 weight % of a tungsten powder (average grain diameter: 0.5 µm, a product of TOKYO TUNGSTEN KABUSHIKI KAISHA), and 100 weight % of an isopropyl alcohol are mixed and dispersed by a planetary ball mill; thus, a slurry is obtained.

Next, alcohol component is removed from the slurry by performing an absorption filtering operation, and the slurry is dried; thus, an aluminium-nitride-tungsten-composite-sintered powder is obtained.

Next, the aluminium-nitride-tungsten-composite-sintered powder is molded and sintered; thus, following two conductive columnar aluminium-nitride-tungsten-composite-sintered-member. One aluminium-nitride-tungsten-composite-sintered-member has 2.5 mm diameter and 6.5 mm length (for electrostatic absorption). The other aluminium-nitride-tungsten-composite-sintered-member has 2.5 mm diameter and 4.5 mm length (for heater). These aluminium-nitride-tungsten-composite-sintered-members are made for upper power supplying terminals 22a, 24a, 24a. Sintering operation is conducted by a hot press under a compressed condition. Above thermal process by using a hot press is performed under condition of 1750° C., and 20 MPa compressing force.

Producing a Lower Power Supplying Terminal 95 weight part of a first silicon-carbide powder (average grain diameter: 0.1 to 10 µm, product of IBIDEN CO., LTD), 5 weight part of a second silicon-carbide powder (average grain diameter: 0.1 µm or lower, product of SUMITOMO OSAKA CEMENT CO., LTD), and 100 weight part of isopropyl alcohol are mixed. Furthermore, the mixture is dispersed uniformly by using a planetary ball mill; thus, a slurry is obtained.

The above second silicon-carbide powder is produced by introducing a material gas which is formed by a silane compound or a silicon halogenide and a hydrocarbon in to a non-oxidizing plasma atmosphere and performing an epitaxial-vapor-deposition while controlling a pressure in a reacting system in a range of 0.1 torr to 1 MPa.

Alcohol portion is removed from the slurry by a method of absorption filtering operation and the slurry is dried. Thus, a mixture of a silicon-carbide powder having two average grain diameters are obtained. Next, the mixture of the powder is molded and sintered by using a hot press. Thus, a conductive silicon-carbide-sintered member having 2.5 mm diameter and 0.5 mm length is obtained. Such a silicon-carbide-sintered member s are used for the lower power supplying terminals 22b, 24b, 24b.

The above sintering operation is performed under conditions such as 2200° C. termperature and 20 MPa compression.

Example 3

An electrode-built-in susceptor according to the example 2 is manufactured according to a method which is described in the example 1. Here, a plasma generating inner electrode 42, a heating inner electrode 18 are disposed in such an order from the mounting surface 12a. Also, the insulating layer 16 is disposed between the plasma generating inner electrode 42 and the heating inner electrode 18.

Evaluation

1. Observation of a Cross Section in the Layered Members

Cross sections of the electrode-built-in susceptors in the above examples 1 to 3 are observed by a scanning-electron-microscope (hereinafter called as an SEM). As a result, it is confirmed that the mounting plate 12, the first intermediate plate 13, the second intermediate plate 14, and the supporting plate 15 which form the susceptor base body are attached together preferably. Also, any cracking is not observed there. Also, it is not observed that an inner electrodes 16, 17 (or 42, 18) are removed thereoff.

Also, an electric conductivity between the power supplying terminals and the inner electrode is desirable; thus, it is confirmed that the power supplying terminals and the inner electrode are connected electrically reliably.

2. Electrostatic Absorbing Characteristics

A silicon wafer having 8-inch diameter is mounted on the mounting surface 12a of the electrode-built-in susceptor according to examples 1, 2. A lead wire is connected to the electrostatic absorbing power supplying terminal 22. A 500 V of direct current is applied between the silicon wafer and an electrostatic power supplying inner electrode 17. Simultaneously, a lead wire is connected to a heating power supplying terminal 24 and a 25 V of direct current is applied there. Thus, the silicon wafer is absorbed under various temperature conditions such as 200° C., 350° C., and 500° C. Electrostatic absorbing forces according to the above conditions are indicated as 276 g/cm$^2$, 184 g/cm$^2$, and 191 g/cm$^2$ respectively. Also, it is observed that the silicon wafer is absorbed preferably under any of the above temperature condition. Also, a leak electricity is measured. As a result, an excessive leak electricity is not observed. Also, it is observed that the leak electricity is no greater than 2×10−5 under 500° C. temperature condition in any of the electrode-built-in susceptors.

3. Anti-plasma Characteristics

A 2 kW of high frequency electricity (frequency: 2.45 GHz) is applied to a plasma generating electrode 42 in a electrode-built-in susceptor according to the example 3. Also, a 25V of direct current is applied to the heating inner electrode 18. A reacting system is operated for 100 hours under 200° C. temperature condition continuously. As a result, no disturbance is observed in controlling a heating inner electrode 18.

4. Thermal Cyclic Test

30 V of direct current is applied to the heating inner electrode 18 in the electrode-built-in susceptor according to the examples 1, 2. The temperature is raised to a predetermined temperature (500° C.) by 20° C./min. under an atmosphere condition. Next, a cyclic thermal load test is performed such that the temperature (500° C.) is maintained for 10 hours and cooled down to a room temperature (25° C.) for 300 times repeatedly. As a result, any cracking is not observed in the electrode-built-in susceptor. Thus, it is confirmed that the electrode-built-in susceptor according to the present invention has a superior durability under an oxidizing high temperature atmosphere condition.

Comparison Example 1

An electrode-built-in susceptor is manufactured according to a method which is described in the Example 1. Here, an insulating layer 16 is not disposed between the mounting surface 12a and an electrostatic absorbing inner electrode 117. The susceptor base body is formed by a mounting plate 12, an intermediate plate 14 and the supporting plate 15.

Comparison Example 2

An electrode-built-in susceptor is manufactured according to a method which is described in the Example 1. Here, an electrostatic absorbing power supplying terminal 22 and the heating power supplying terminals 24, 24 are made of a conductive aluminium-nitride-tungsten-composite-sintered-member. Here, such an aluminium-nitride-tungsten-composite-sintered-member is made by mixing 28 weight % of the aluminium-nitride powder and 72 weight % of the tungsten powder and sintering the mixture by a hot press under condition such as 1750° C. temperature and 20 MPa compression.

Comparison Example 3

An electrode-built-in susceptor is manufactured according to a method which is described in the Example 3. Here, an insulating layer 16 is not disposed between the plasma generating electrode 42 and the heating inner electrode 117. The susceptor base body is formed by a mounting plate 12, an intermediate plate 14 and the supporting plate 15.

Cross sections of the electrode-built-in susceptors in the above examples 1 to 3 are observed by a scanning-electron-microscope (hereinafter called as an SEM). As a result, it is confirmed that the members which form the susceptor base body are attached together preferably. Also, any cracking is not observed there. Also, it is not observed that an electrostatic absorbing inner electrode, and a heating inner electrodes are removed thereoff.

Also, an electric conductivity between the heating power supplying terminals and the heating inner electrode is desirable, and an electric conductivity between the electrostatic absorbing power supplying terminal and the electrostatic absorbing inner electrodes is desirable; thus, it is confirmed that the members which form the electrode-built-in susceptor are electrically connected reliably.

Also, a silicon wafer is mounted electrostatically on the mounting surface in the electrode-built-in susceptor of the Comparison Examples 1, 2 according to the Examples 1 to 3. As a result, it is possible to absorb the silicon wafer electrostatically on the mounting surface under any temperature condition. However, when a leak electricity is measured, $1.5 \times 10^{-3}$ A or more leak electricity is observed under 500° C. in any of the electrode-built-in susceptors.

In the electrode-built-in susceptor in the Comparison Example 2, a thermal cyclic load is applied to the electrode-built-in susceptor seven times according to the same condition as that in the Examples 1 to 3. As a result, a power supplying terminal is oxidized; thus, the electrode-built-in susceptor was broken.

Furthermore, 2 kW of high frequency voltage (frequency 2.45 GHz) is applied to the plasma generating inner electrode in the electrode-built-in susceptor of the Comparison Example 3. Also, 25 V of direct currency voltage is applied to the heating inner electrode. A continuous operation is performed for eight hours under 200° C. temperature condition. As a result, it is not possible to control the heating inner electrode.

What is claimed is:

1. An electrode-built-in susceptor for a plasma processing apparatus comprising:
    a susceptor base body made of an aluminum-nitride-group-sintered-member having a mounting surface for carrying a plate sample thereon for semiconductor wafer processing;
    an inner electrode which is built in the susceptor member base body;
    a power supplying terminal disposed in the susceptor base body, the power supplying terminal contacting the inner electrode, the power supplying terminal being formed by a conductive aluminum-nitride-tantalum-nitride-composite-sintered-member; and
    an insulating layer formed by one of a boron nitride, a lithium oxide, an aluminum oxide, or a magnesium oxide, the insulating layer being formed between the inner electrode and the mounting surface.

2. An electrode-built-in susceptor for a plasma processing apparatus comprising:
    a susceptor base body made of an aluminum-nitride-group-sintered-member having a mounting surface for carrying a plate sample thereon for semiconductor wafer processing;
    a plurality of inner electrodes built in the susceptor base body;
    a plurality of power supplying terminals disposed in the susceptor base body, each power supplying terminal contacting the respective inner electrodes, each power supplying terminal being formed by a conductive aluminum-nitride-tantalum-nitride-composite-sintered-member; and
    an insulating layer which is formed by at least a boron nitride, a lithium oxide, an aluminum oxide, or a magnesium oxide, the insulating layer being formed at one of: between the inner electrode disposed nearest the mounting surface, and the mounting surface; and between an adjacent pair of the plurality of inner electrodes adjacent to each other.

* * * * *